United States Patent [19]

Teng et al.

[11] Patent Number: 4,877,751

[45] Date of Patent: Oct. 31, 1989

[54] METHOD OF FORMING AN N+ POLY-TO-N+ SILICON CAPACITOR STRUCTURE UTILIZING A DEEP PHOSPHOROUS IMPLANT

[75] Inventors: Chih-Sieh Teng; Tian-I Liou, both of San Jose; Hiekyung Chun-Min, Los Altos, all of Calif.

[73] Assignee: National Semiconductor Corporation, Santa Clara, Calif.

[21] Appl. No.: 166,973

[22] Filed: Mar. 11, 1988

[51] Int. Cl.$^4$ .............................................. H01L 21/94
[52] U.S. Cl. ........................................ 437/47; 437/34; 437/57; 437/60; 437/919; 437/985; 148/DIG. 163; 357/23.6
[58] Field of Search ................... 357/23.6, 54; 437/47, 437/48, 51, 60, 919, 985; 148/DIG. 14, DIG. 116, DIG. 117, DIG. 118

[56] References Cited

U.S. PATENT DOCUMENTS

| | | | |
|---|---|---|---|
| 4,426,687 | 1/1984 | Masuoka | 357/23.6 |
| 4,466,177 | 8/1984 | Chao | 437/60 |
| 4,506,436 | 3/1985 | Bakeman, Jr. et al. | 357/23.6 |
| 4,571,607 | 2/1986 | Togei | 357/23.6 |
| 4,577,390 | 3/1986 | Hakem | 357/54 |

FOREIGN PATENT DOCUMENTS 0200564  11/1983  Japan ................................. 437/919

OTHER PUBLICATIONS

Ho et al., "ULSI Process Modeling-SUP12EM111", IEEE Trans. on Elect. Devices, vol. ED.30, No. 11, Nov. 83, pp. 1438-1453.
Ghandhi, "ULSI Fabrications Principles", John Wiley & Sons, 1983, pp. 300-302, 383-384.
Deal et al., "Thermal Oxidation of Heavily Doped Silicon", J. of Electrochemical Society, Apr. 1965, pp. 430-435.
Ho et al., "Si/SiO$_2$ Interface Oxidation Kinetics, A Physical Model for the Influence of High Substrate Doping Levels", J. of Electrochemical Society, Sep. 1979, pp. 1516-1530.
Sodini, "Enhanced Capacitor for One-Transistor Memory Cell", IEEE Trans. on Elect. Devices, Oct. 1976, pp. 1187-1189.
Bolt et al., "Design of a High Performance 1024-6 Switched Capacitor P-Channel IGFET Memory Chip", IEEE J. Solid State Circuits, vol. SC-8, Oct. 73, pp. 310-318.
McCreary, J. L. et al., "All-MOS Charge Redistribution Analog-to-Digital Conversion Techniques-Part 1", IEEE Journal SC10(6): 371-379 (1975).
Ho, C. P. et al., "Si SiO$_2$ Interface Oxidation Kinetics: A Physical Model for the Influence of High Substrate Doping Levels", J. Electrochem. Soc., pp. 1516-1522, (1979).
Brown, D. et al., "Advanced Analog CMOS Technology", IEEE Journal, pp. 261-263 (1985).
Shah, P. et al., "High Performance CMOS Technology for Telecommunication and Linear Circuit Applications", IEEE Journal, pp. 51-56 (1983).
McCreary, J. L., "Matching Properties, and Voltage and Temperature Dependence of MOS Capacitors", IEEE Journal, SC-16(6):608-616 (1981).

Primary Examiner—Brian E. Hearn
Assistant Examiner—Tom Thomas
Attorney, Agent, or Firm—Limbach, Limbach & Sutton

[57] ABSTRACT

An N+ poly-to-N+ silicon capacitor structure is provided by adding a single mask step to a standard CMOS process flow. The capacitor oxide between the N+ poly plate and the N+ silicon plate is grown simultaneously with gate oxide for the MOSFET devices. A high dose, deep phosphorous implant is employed to form the N+ substrate plate. This results in an excellent capacitance voltage coefficient. The resulting thin interplate oxide leads to high capacitance per unit area and, thus, small die size.

24 Claims, 5 Drawing Sheets

METHOD OF FORMING AN N+ POLY-TO- N+ SILICON CAPACITOR STRUCTURE UTILIZING A DEEP PHOSPHOROUS IMPLANT

BACKGROUND OF THE INVENTION

1. Field of the Invention

The present invention relates to semiconductor integrated circuits and, in particular, to a method of fabricating an N+ polysilicon-to-N+ silicon capacitor structure utilizing a high-energy, high-dose phosphorous implant to form a high-quality interplate dielectric which is grown simultaneously with gate oxide in the standard CMOS process flow. The resulting capacitor exhibits high capacitance per unit area and a low voltage coefficient of capacitance.

2. Discussion of the Prior Art

Integrated capacitors are key elements of advanced analog complimentary-metal-oxide-semiconductor (CMOS) integrated circuits, particularly in the areas of analog-to-digital (A/D) converters and switched capacitor filters.

Various capacitor structures have been used in analog CMOS IC devices.

Metal-to-metal and polysilicon-to-metal capacitors are described by D. Brown et al, "Advanced Analog CMOS Technology", IEDM 1985, p. 260. A poly-to-poly switched capacitor structure is described by P. Shah et al, "High Performance CMOS Technology for Telecommunications and Linear Circuit Applications", proceedings of the Custom Integrated Circuit Conference, Rochester N.Y. 1983, p. 51. Poly-to-silicon capacitor structures are described by McReary, "Matching Properties, and Voltage and Temperature Dependance of MOS Capacitors", IEEE Journal of Solid-State Circuits, Vol. SC-16, No. 6, Dec. 1981, p. 608.

Each of these capacitor structures has its own advantages and disadvantages. The selection of capacitor structure is generally based upon several criteria such as high value of capacitance per unit area, low voltage coefficient of capacitance and the process simplicity with which the capacitor structure can be fabricated.

In the past, one of the major disadvantages associated with the utilization of poly-to-silicon capacitors in an analog CMOS process has been the additional process complexity required to fabricate the capacitors. Specifically, because of the different characteristics required for the gate oxide of the MOSFET devices in the circuit and for the interplate dielectric oxide of the capacitors, it has been necessary to grow these two layers independently.

SUMMARY OF THE INVENTION

The present invention provides an N+ poly-to-N+ silicon capacitor structure which is fabricated by adding only one additional mask step to a conventional CMOS process. By utilizing a high-dose, deep phosphorous implant to form the N+ silicon capacitor plate, the capacitor oxide between the N+ poly plate and the N+ silicon plate may be grown simultaneously with the gate oxide for the MOSFET devices in the circuit. The thin interplate oxide grown by this method leads to high capacitance per unit area and, thus, small die size. The deep phosphorous implant results in an excellent capacitance voltage coefficient.

Other features and advantages of the present invention will be better understood and appreciated by reference to the detailed description of the invention provided below which should be considered in conjunction with the accompanying drawings.

DETAILED DESCRIPTION OF THE INVENTION

In accordance with the present invention, the steps for fabricating an N+poly-to N+silicon capacitor structure are incorporated into a standard CMOS process to provide an analog CMOS process.

Figure 1:
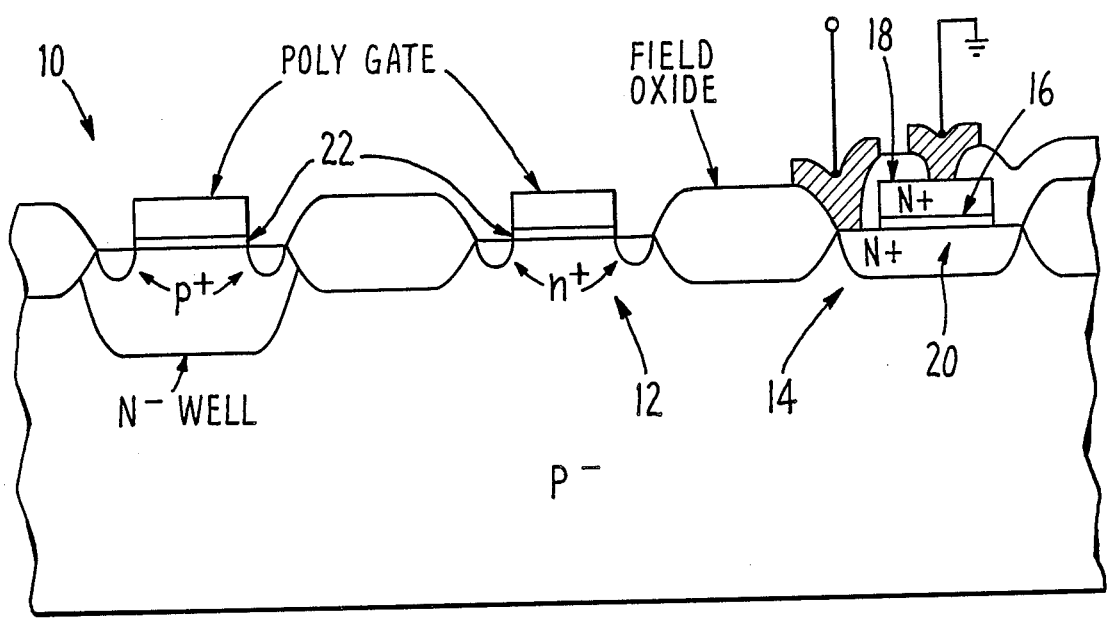
FIG. 1 is a cross-sectional view illustrating an integrated circuit structure formed by an analog CMOS process using an N+ poly-to-N+ silicon capacitor in accordance with the present invention.

A cross section of an integrated circuit device structure fabricated in accordance with this analog CMOS process is illustrated in FIG. 1 in which PMOSFET 10, NMOSFET 12 and N+poly-to-N+silicon capacitor structure 14 are shown.

According to the process of the present invention, the capacitor oxide 16 between N+ polysilicon capacitor plate 18 and N+ silicon substrate region 20 is grown simultaneously with the gate oxide 22 for the PMOSFET and NMOSFET devices 10 and 12, respectively. Therefore, because of the high quality requirements of the gate oxide 22, a high quality interplate oxide 16 can also be ensured and very few extra process steps need be added to the standard CMOS process flow.

As described in greater detail below, a high-dose, deep phosphorus implant is employed to form the N+ silicon region 20, resulting in an excellent capacitance voltage coefficient. The thin interplate oxide leads to high capacitance per unit area and, thus, small die size.

Figure 2:
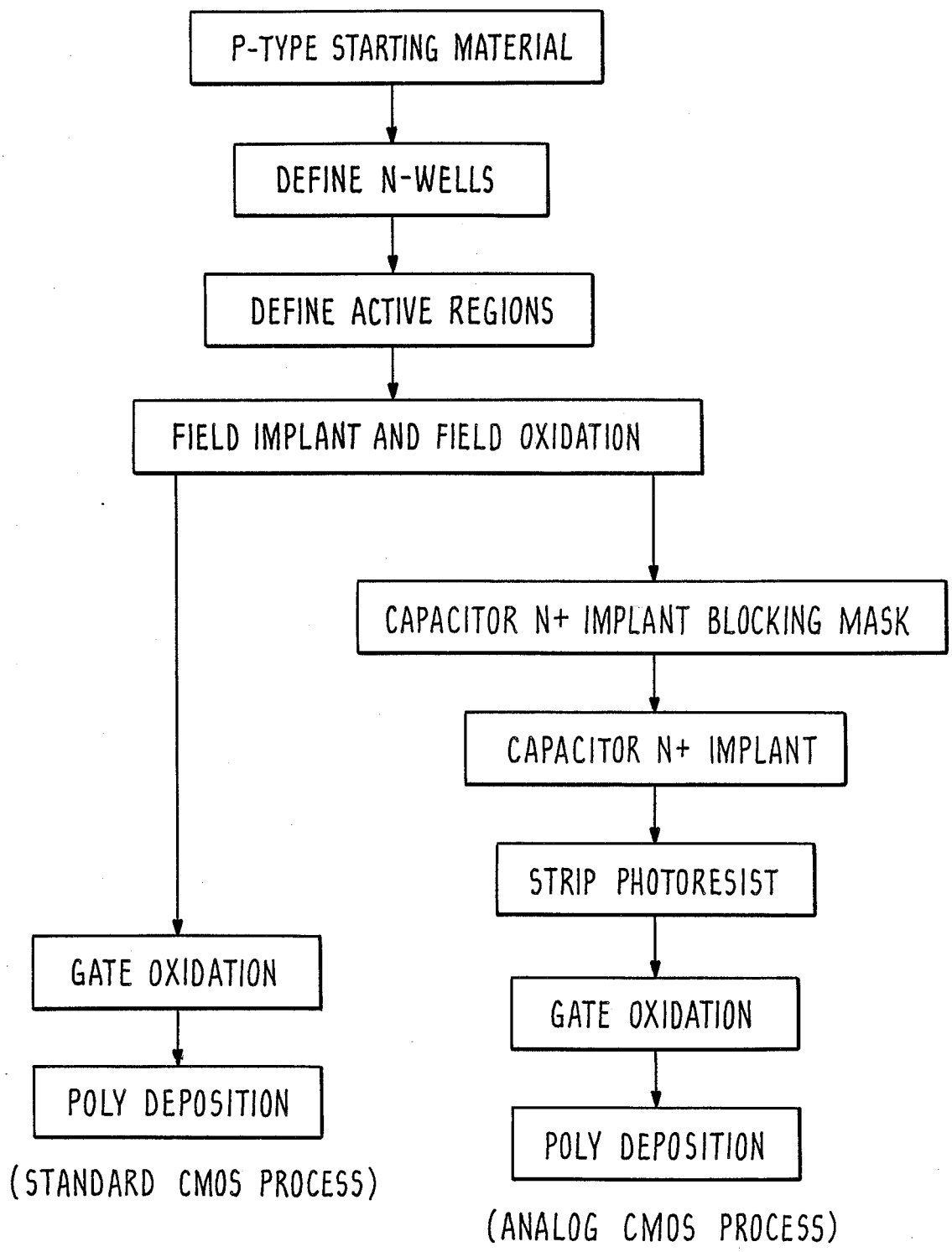
FIG. 2 is a flow diagram illustrating the flow of a standard CMOS process and of a merged analog CMOS process flow which includes formation of an N+ poly-to-N+ silicon capacitor structure in accordance with the present invention.

A standard CMOS process flow is shown in FIG. 2. FIG. 2 also shows a merged analog CMOS process flow for the formation of an N+poly-to-N+silicon capacitor 14 in accordance with the present invention.

Referring to the device cross-section provided in FIG. 1 and the process flow provided in FIG. 2, according to the standard CMOS process, an N well region is first defined in P type silicon substrate material. Next, the device active regions for PMOSFET and NMOSFET devices 10 and 12, respectively, are formed after growth of field oxide isolation regions. This is followed sequentially by growth and definition of gate oxide and polysilicon gate regions for the MOSFET devices 10 and 12 and by the self-aligned implant of dopant to form the p+ and n+ source/drain regions of devices 10 and 12, respectively.

According to the present invention, the field oxidation step of the standard process is followed by formation of a photoresist blocking mask which defines the substrate implant region for N+ silicon capacitor plate 20. A deep, high-energy phosphorous implant is then performed in the exposed active regions to form N+ silicon capacitor plate 20. The photoresist blocking mask is then stripped and the standard process flow resumes with the growth of the gate oxide for the MOSFET devices 10 and 12 and the simultaneous growth of the dielectric oxide 16 between the silicon capacitor plate 20 and a polysilicon capacitor plate 18 which is defined from the polysilicon gate material.

As can be seen in the FIG. 2 flow, only one extra mask is required to prevent the capacitor phosphorus implant from entering other active regions.

Because of the deep phosphorous implant to region 20, a capacitor interplate oxide 16 which is thicker than the gate oxide 22 is grown simultaneously with the gate oxide 22 during the gate oxidation cycle. As discussed by Ho and Plummer, "Si/SiO2 Interface Oxidation Kinetics: A Physical Model for the Influence of High Substrate Doping Levels", Journal of the Electrochemical Society, Sept. 1979, p. 1516, it is well-known that oxidation rate is enhanced with increasing substrate impurity concentrations. In order to obtain a thin oxide between N+ poly 18 and N+ silicon region 20, the N+ doping concentration at the surface of region 20 must be low at the onset of the oxidation cycle. However, to achieve a low voltage coefficient of poly-to-silicon capacitance, the impurity concentration at the SiO2/Si interface in the final capacitor structure must be high. As stated above, the process of the present invention uses a high-energy, high-dose phosphorus implant to form N+ silicon regions 20. This high-energy, deep implant is utilized to locate the peak of the ion distribution deeply in the P type silicon substrate so that the concentration of phosphorus at the silicon surface is low enough at the beginning of the oxide growth cycle to produce an acceptably thin interplate oxide. However, due to pile-up of phosphorus at the Si/SiO2 interface during the oxidation cycle, the high-energy implant also results in an impurity concentration which is uniformly distributed and high enough to achieve a highly-desirable low voltage coefficient of capacitance.

Figure 3:
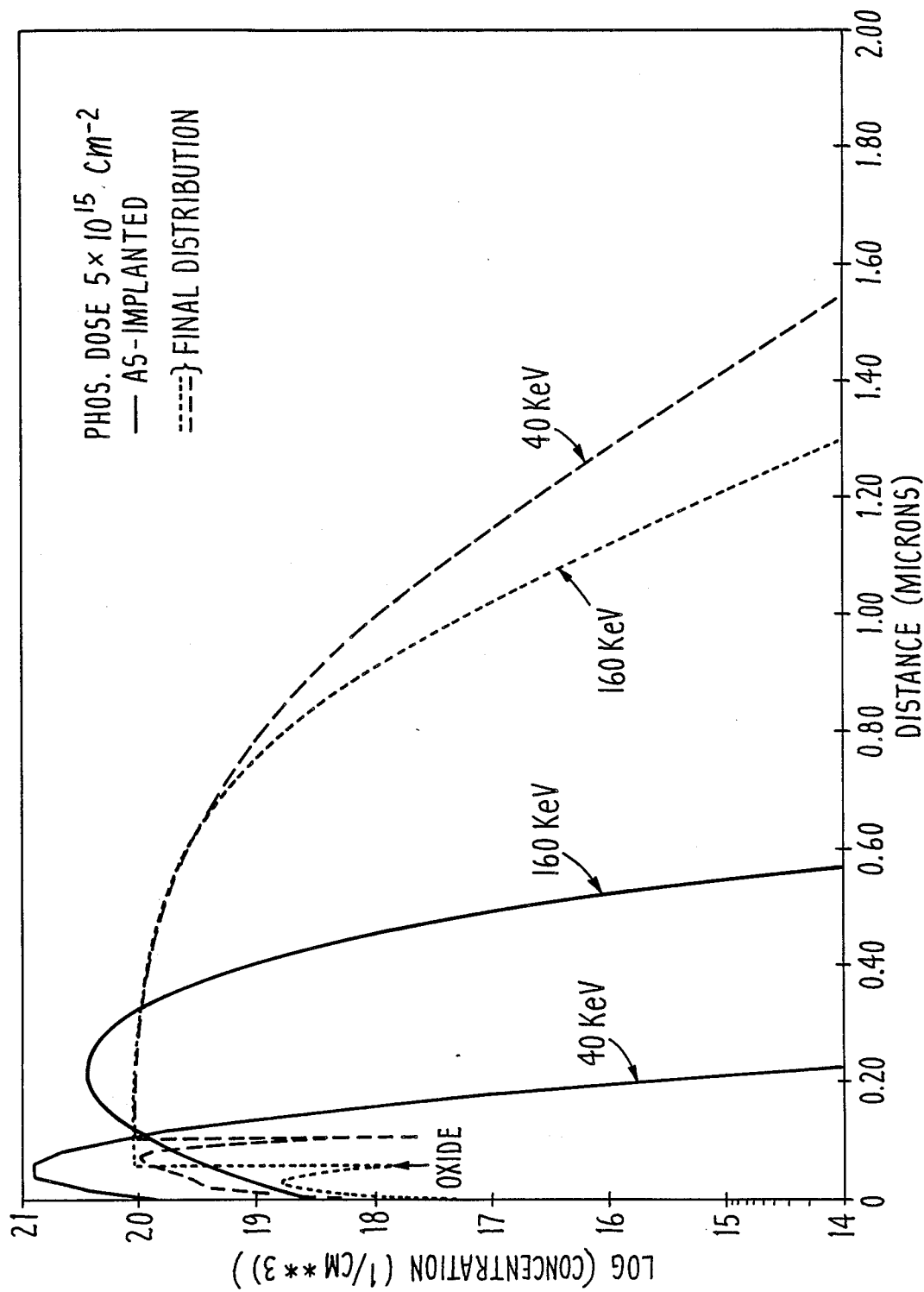
FIG. 3 is a graph illustrating simulated impurity profiles of as-implanted phosphorous with energies of 40 KeV and 160 KeV and their respective final distributions after capacitor oxidation and several heat cycles.

The impurity profiles of as-implanted phosphorus which is implanted into bare silicon as described above have been simulated using SUPREM-3, a well-known simulator developed by Stanford University. FIG. 3 shows these as-implanted profiles of phosphorus with the same dose of $5 \times 10^{15}$ P/cm$^2$ for implant energies of 40 Kev and 160 Kev. It can be clearly seen from these two as-implanted curves that the deep implant provides a much lower surface doping concentration than does the shallow implant. The final simulated phosphorus concentration profiles after capacitor oxidation at 900° C. and several other heat cycles for both cases are also shown in FIG. 3. It should also be observed in FIG. 3 that the high-energy implant results in a thinner capacitor oxide; the low-energy implant results in a thicker oxide which makes small die size harder to achieve. It is also very important to note that the final phosphorus concentration at the Si/SiO2 interface is almost the same for both the deep and the sallow implants. As a consequence, low capacitor oxide thickness as well as low voltage coefficient can be achieved simply by utilizing our deep phosphorous implant approach.

Figure 4:
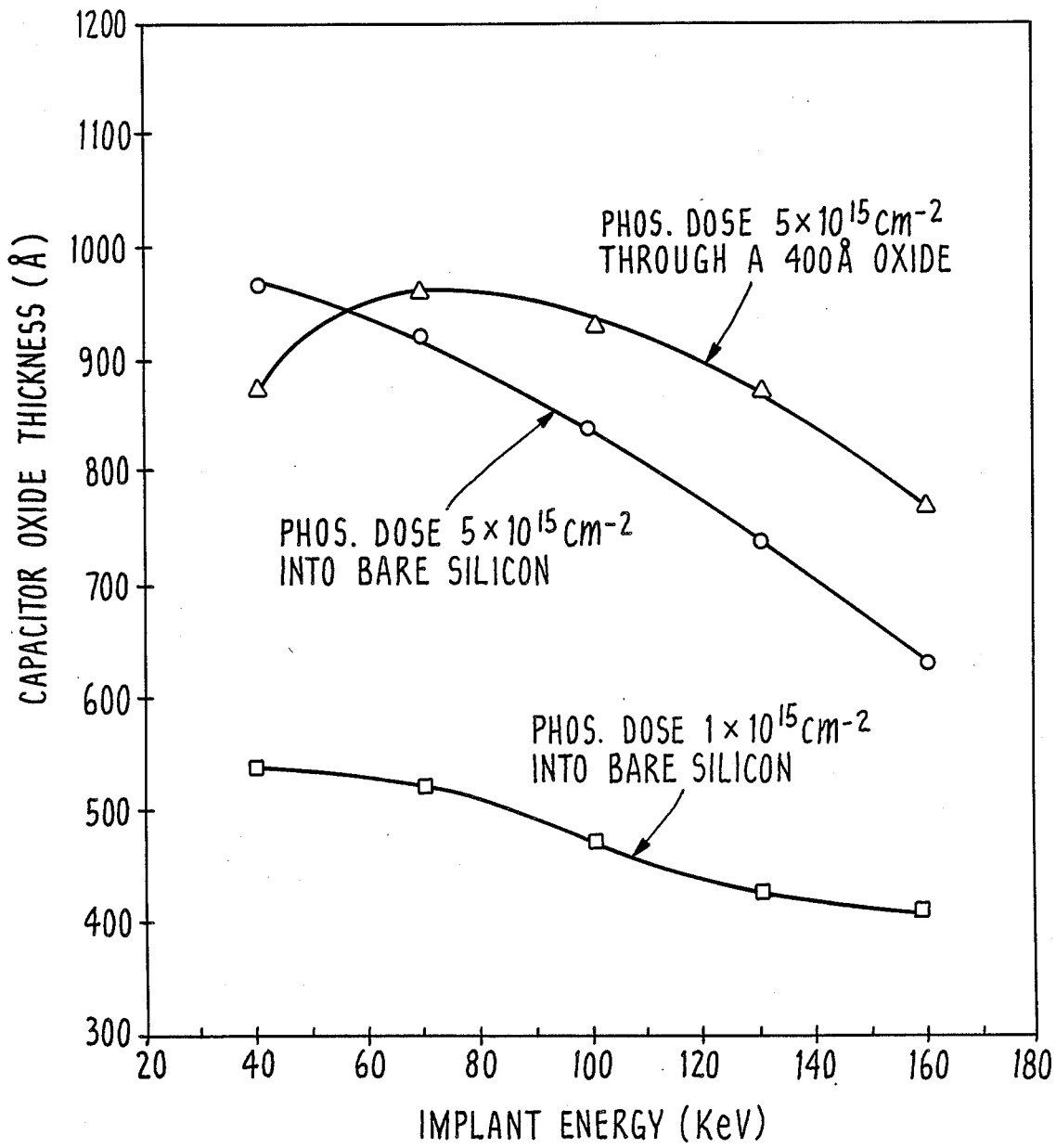
FIG. 4 is a graph illustrating simulated implant energy dependence of capacitor interplate oxide thickness between silicon and poly for phosphorous implanted into bare silicon and through a 400 Angstrom oxide.

The oxide thickness between poly plate 18 and N+ silicon plate 20 was also simulated, using SUPREM-2, a well-known simulator developed by Stanford University, as a function of phosphorous implant energy for two different conditions: (1) implantation into bare silicon and (2) implantation through 400 Å oxide, representing pad oxide remaining from the field oxidation cycle and which must be stripped before growth of capacitor oxide. The purpose of the simulation was to determine the feasibility of performing the deep phosphorous implant prior to removal of the pad oxide. The simulated capacitor oxide thickness versus phosphorous implant energy is shown in FIG. 4. As can be seen from FIG. 4, the oxide is thicker at low implant energies and becomes thinner with increasing implant energy for the implantation into bare silicon. On the other hand, for implanting through a 400 Å oxide, the peak of the phosphorous as-implanted profile is in the oxide for low-energy implant and the peak moves to the Si/SiO2 interface and then to the bulk of the silicon with increasing implant energy. This implies that the impurity concentration at the Si/SiO2 interface is low at both low and high implant energies and is high at some medium energies, resulting in a peak on the curve for implanting through a 400 Å oxide in FIG. 4. Based on these results, it is obvious that implant into bare silicon is performed.

Based on these simulation results, it is also apparent that the dose and energy of phosphorous implant in the poly-to-silicon capacitor structure formed by the process of the present invention must be optimized to achieve the simultaneous requirements of low capacitance voltage coefficient and thin oxide capacitor. To obtain the required 600 Å capacitor oxide thickness while maintaining a 400 Å gate oxide thickness, the dose and implant energy for the phosphorous implant are about $3.5 \times 10^{15}$ cm$^{-2}$ and about 160 KeV, respectively, for the particular process we have investigated. It should be understood, however, that the implant dose and implant energy required to obtain desired capacitor characteristics will be specifically related to the particular process being utilized as well as to device density and die size requirements. In general, the desired capacitor characteristics will be obtained by utilizing a phosphorous implant dose greater than $10^{15}$ cm$^{-2}$ and an implant energy greater than 100 KeV. (It should be noted that utilization of an arsenic implant was investigated but found to produce results inferior to those obtained utilizing phosphorous.)

Figure 5:
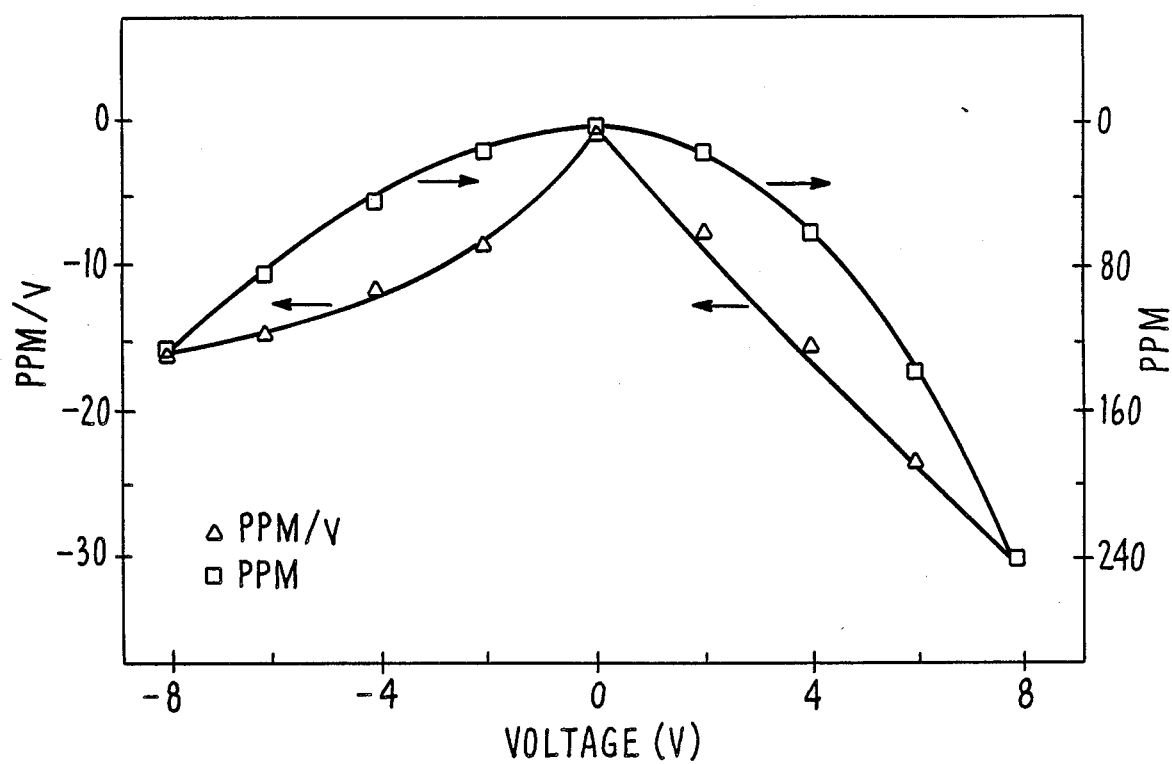
FIG. 5 is a graph illustrating voltage coefficient of capacitance versus applied voltage across an N+ poly-to-N+ silicon capacitor fabricated in accordance with the present invention.

A plot of voltage coefficient of capacitance versus applied voltage across the N+poly-to-N+silicon capacitor is shown in FIG. 5. The voltage is applied at the N+ silicon plate 20 and the poly plate 18 is grounded. As can be observed from FIG. 5, the curve of voltage coefficient of capacitance is almost symmetrical about zero-applied voltage. This symmetrical behavior is caused by utilizing the same type of doping and the same dose doping concentration for both poly 18 and N+ silicon 20. The lower voltage coefficient at positive applied voltages is due to the slightly lower doping concentration of N+ silicon compared to that of poly. The variation of capacitance voltage coefficient achieved, utilizing this N+poly-to-N+silicon capacitor structure, is within 50 ppm/V for a 10 V operation.

In summary, the present invention provides a N+poly-to-N+silicon capacitor structure formed by utilizing a high-energy, deep phosphorus implant. The capacitor interplate oxide is grown simultaneously with gate oxide in a CMOS process to ensure high quality of this oxide. The deep phosphorus implant leads to a low surface concentration and, hence, to an acceptably thin interplate oxide. On the other hand, due to pile-up of phosphorus at the Si/SiO$_2$ interface during oxide growth, the high-dose deep phosphorus implant also leads to a high enough surface concentration after capacitor oxidation to produce an excellent voltage coefficient of capacitance.

It should be understood that various alternatives to the process and structure described herein may be employed in practicing the invention. It is intended that the following claims define the scope of the invention and that methods within the scope of these claims and their equivalents be covered thereby.

What is claimed is:

1. In a process for fabricating an integrated circuit device structure on a substrate of semiconductor material having a first conductivity type, the improvement comprising:
    modifying a first region of the substrate by introducing an impurity thereto such that the first region has a conductivity type opposite to that of the substrate, the impurity having a peak concentration below the surface of the first region so that a layer of dielectric material subsequently grown over the first region has a first preselected thickness;
    simultaneously growing a layer of dielectric material over the first region and over a second region of the substrate, the thickness of the dielectric layer grown over the second region differing in thickness from the thickness of the dielectric layer grown over the first region, the thickness of the dielectric layer over the second region being a second preselected thickness; and
    forming a layer of conductive material over the dielectric layer such that a capacitor structure formed by the first region, the layer of dielectric material overlying the first region and the layer of conductive material has a preselected voltage coefficient.

2. A process as in claim 1 wherein the substrate comprises silicon, the dielectric material comprises an oxide of silicon and the conductive material comprises polycrystalline silicon.

3. A process as in claim 1 wherein the substrate comprises P type silicon and the first region is modified by introducing a N type impurity thereto.

4. A process as in claim 3 wherein the N type impurity comprises phosphorous.

5. A process as in claim 4 wherein the phosphorous is implanted into the first region at a dose greater than $10^{15}$ cm$^{-2}$ and an implant energy greater than 100 KeV.

6. A process as in claim 4 wherein the phosphorous is implanted into the first region at a dose and energy of about $3.5 \times 10^{15}$ cm$^{-2}$ and about 160 KeV, respectively.

7. A process as in claim 2 wherein the silicon oxide grown over the first region is about 600 Å thick and the silicon oxide grown over the second region is about 400 Å thick.

8. A method of fabricating elements of a capacitor while simultaneously fabricating elements of a MOS transistor, the method comprising the steps of:
    (A) defining a plurality of active regions in a silicon substrate having a first conductivity type;
    (B) one of the active regions forming a first plate of the capacitor by introducing an impurity directly into the first active region such that the active region has a conductivity type opposite the first conductivity type, the impurity having a peak concentration below the surface of the first active region so that a layer of dielectric material simultaneously grown over the modified active region and a second active region have different thicknesses, the impurity concentration at the interface between the active region and the dielectric material grown over the first active region being preselected;
    (C) simultaneously growing a layer of dielectric material over the first active region and the second active region, the dielectric material grown over the first active region providing a capacitor interplate dielectric having a first preselected thickness and the dielectric material grown over the second active region providing a gate dielectric for the MOS transistor and having a second preselected thickness; and
    (D) forming a layer of conductive material over the layer of dielectric material, the conductive material formed over the dielectric material over the first active region providing a second plate of the capacitor and the conductive material formed over the dielectric material grown over the second active region providing a gate of the MOS transistor.

9. A process as in claim 8 wherein the substrate comprises P type silicon and the first active region is modified by introducing N type impurity thereto.

10. A process as in claim 9 wherein the N type impurity comprises phosphorous.

11. A process as in claim 10 wherein the phosphorous is implanted into the first active region at a dose of greater than $10^{15}$ cm$^{-2}$ and an implant energy greater than 100 KeV.

12. A process as in claim 10 wherein the phosphorous is implanted into the first active region at a dose and energy of about $3.5 \times 10^{15}$ cm$^{-2}$ and about 160 KeV, respectively.

13. A process as in claim 12 wherein the dielectric layer grown is silicon oxide, the silicon oxide grown over the first active region is about 600 Å thick and the silicon oxide grown over the second active region is about 400 Å thick.

14. A process for fabricating an integrated circuit structure in a semiconductor substrate of a first conductivity type, the process comprising:
    (A) introducing an impurity into a first substrate region such that the first substrate region is of a conductivity type opposite the first conductivity type; and
    (B) simultaneously forming a layer of dielectric material over the first substrate region and a second substrate region such that the thickness of the dielectric over the first substrate region and over the second substrate region differ, the impurity having been introduced into the first substrate region such that the peak concentration of the impurity prior to growth of the dielectric material over the first substrate region is at a depth such that the growth of the dielectric over the first substrate region results in a preselected impurity concentration at the interface between the first substrate region and the dielectric so that a capacitor structure comprising the first substrate region has a predetermined voltage coefficient.

15. A process as claim 14 wherein the thickness of the dielectric layer over the first substrate region is of a first preselected thickness and the thickness of the dielectric over the second substrate region is of a second preselected thickness.

16. A process as in claim 14 wherein the substrate comprises silicon and the dielectric material comprises an oxide of silicon and the conductive material comprises polycrystalline silicon.

17. A process as in claim 15 wherein the substrate comprises P type silicon and the impurity introduced into the first substrate region is an N type impurity.

18. A process as in claim 17 wherein the N type impurity comprises phosphorous.

19. A process as in claim 18 wherein the phosphorous is introduced into the first substrate region at a dose greater than $10^{15}$ cm$^{-2}$ and an implant energy greater than 100 KeV.

20. A process as in claim 18 wherein the phosphorous is implanted into the first substrate region at a dose and energy of about $3.5 \times 10^{15}$ cm$^{-2}$ and about 160 KeV, respectively.

21. A process as in claim 16 wherein the silicon oxide formed over the first substrate region is about 600 Å thick and the silicon oxide formed over the second substrate region is about 400 Å thick.

22. A process as in claim 14 further comprising the steps of:
    forming a layer of conductive material over the layer of dielectric material.

23. A process as in claim 22, wherein the device of the first substrate region is a capacitor structure and the device of the second substrate region is a transistor structure.

24. The process of claim 1, wherein the device of the first region is a capacitor structure and the device of the second region is a transistor structure.

* * * * *